United States Patent
Liao et al.

(10) Patent No.: US 10,090,967 B2
(45) Date of Patent: Oct. 2, 2018

(54) DECODING APPARATUS AND DECODING METHOD INCLUDING ERROR CORRECTION PROCESS BASED ON POWER DIFFERENCES

(71) Applicant: MStar Semiconductor, Inc., Hsinchu Hsien (TW)

(72) Inventors: Yi-Ying Liao, Hsinchu Hsien (TW); Chen-Yi Liu, Hsinchu Hsien (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 0 days.

(21) Appl. No.: 15/285,645

(22) Filed: Oct. 5, 2016

(65) Prior Publication Data
US 2017/0373798 A1    Dec. 28, 2017

(30) Foreign Application Priority Data

Jun. 22, 2016   (TW) .............................. 105119499 A

(51) Int. Cl.
*H04L 1/00* (2006.01)
*H03M 13/00* (2006.01)
*H03M 13/27* (2006.01)

(52) U.S. Cl.
CPC .......... *H04L 1/0061* (2013.01); *H03M 13/27* (2013.01); *H03M 13/6555* (2013.01); *H04L 1/0047* (2013.01); *H04L 1/0071* (2013.01)

(58) Field of Classification Search
None
See application file for complete search history.

(56) References Cited

U.S. PATENT DOCUMENTS

| | | | | |
|---|---|---|---|---|
| 5,812,603 A | * | 9/1998 | Luthi | H04L 1/0045 375/287 |
| 7,397,866 B2 | * | 7/2008 | Hwang | H04L 1/0618 375/316 |
| 9,264,216 B1 | * | 2/2016 | Vu | H04L 1/206 |
| 9,747,790 B1 | * | 8/2017 | Mesbah | G08C 25/02 |
| 2002/0186793 A1 | * | 12/2002 | Kolze | H04L 5/02 375/324 |
| 2012/0226955 A1 | * | 9/2012 | Norair | H04L 1/0061 714/752 |
| 2015/0215010 A1 | | 7/2015 | Shim et al. | |

FOREIGN PATENT DOCUMENTS

| | | |
|---|---|---|
| CN | 103441804 A | 12/2013 |
| JP | 2010220363 A * | 9/2010 |

* cited by examiner

*Primary Examiner* — Justin R Knapp
(74) *Attorney, Agent, or Firm* — Edell, Shapiro & Finnan, LLC

(57) ABSTRACT

A decoding apparatus includes an input power estimating circuit, an error correction decoder and a controller. The input power estimating circuit generates multiple estimated input powers for multiple sets of data included in a packet that needs to be corrected, and calculates respective power differences between the multiple estimated input powers and a reference power. The controller determines one or multiple candidate error positions according to one of the multiple power differences that is higher than a predetermined threshold. The error correction decoder performs a decoding process on the packet according to the one or multiple candidate error positions.

4 Claims, 3 Drawing Sheets

DECODING APPARATUS AND DECODING METHOD INCLUDING ERROR CORRECTION PROCESS BASED ON POWER DIFFERENCES

This application claims the benefit of Taiwan application Serial No. 105119499, filed Jun. 22, 2016, the subject matter of which is incorporated herein by reference.

BACKGROUND OF THE INVENTION

Field of the Invention

The invention relates in general to an error correction decoder, and more particularly to a technology capable of increasing the probability of successful error correction.

Description of the Related Art

A signals may be distorted as channels for transmitting signals are often interfered by various types of noises in real environments. Having arrived at a receiver, the distorted signal is down-converted to a baseband digital signal, demodulated by a demodulator, and decoded by a decoder. Further, an error bit in the signal is corrected. One most important task of an error correction code is correcting errors generated during the process of signal transmission to achieve highly reliable signal transmission. A Reed-Solomon code is a type of error correction code commonly applied in high-speed digital communication transmission systems. The Reed-Solomon code provides outstanding error correction capability on burst errors or random errors generated during the transmission process, and is thus a popular means for channel error correction encoding/decoding.

FIG. 1(A) shows an example of a function block diagram of a Digital Video Broadcasting-Cable (DVB-C) transmitter. An audiovisual decoder 111 encodes video data, audio data and other auxiliary data to a series of audiovisual encoded packets, each of which having a length of 188 bytes. An outer encoder 112 performs Reed-Solomon encoding on the audiovisual encoded packets. With a 16-byte check code added, the length of each outer encoded packet outputted by the outer encoder 11 is increased to 204 bytes. Alternatively, it is commonly regarded that each of the outer encoded packets includes 204 symbols. Next, an outer interleaver 113 performs a convolutional interleaving process on the outer encoded packets so that the order of the data is rearranged to reinforce an error tolerance of the data. A differential encoder 114 performs a differential encoding process on two most significant bits (MSB) of each of the symbols. A modulator 115 then performs quadrature amplitude modulation (QAM) on the differential encoded data, and forwards the modulated data to a frontend circuit 116 that performs up-conversion and digital-to-analog conversion processes.

FIG. 1(B) shows a function block diagram of a DVB-C receiver. By comparing FIG. 1(A) and FIG. 1(B), it is observed that, after entering the receiver, the signal sequentially passes a frontend circuit 121, a demodulator 122, a differential decoder 123, an outer deinterleaver 124, an error correction decoder 125 and an audiovisual decoder 126, which respectively correspond to the function blocks in the transmitter shown in FIG. 1(A). Each of the packets to be corrected received by the error correction decoder 125 includes 204 symbols, which include one or multiple symbols containing errors caused by noise interference during the transmission process. The error correction decoder 125 performs decoding according to characteristics of the Solomon-Reed coding, and at the same time identifies and corrects the errors.

The error correction capability of a Reed-Solomon decoder is associated with the number of check codes—the larger the amount of check codes is, the higher the error correction capability the decoder has. Assuming that in a packet, among n symbols, k symbols are actual data and (n−k) symbols are check codes, a limit of the error correction capability of the Reed-Solomon decoder is (n−k) symbols. More specifically, given that positions of all erroneous symbols in the packet are known in advance (without knowing actual contents of the errors), the Reed-Solomon decoder is capable of correcting at most (n−k) number of erroneous symbol contents. However, without knowing positions and contents of any of the erroneous symbols, the Reed-Solomon decoder can only correct at most (n−k)/2 number of erroneous symbol contents. Combining the two situations above, assuming that the positions of F number of erroneous symbols in one packet are learned in advance and F is smaller than (n−k), in addition to correcting the F erroneous symbols, the Reed-Solomon is capable of further correcting at most E number of erroneous symbols (without knowing the positions of these erroneous symbols), where a limit of the amount E is [(n−k)−F]/2. Thus, the error correction capability of a Reed-Solomon decoder is often represented as $2E+F \le (n-k)$.

Taking the DVB-C receiver shown in FIG. 1(B) for example, in each packet to be corrected received by the error correction decoder 125, 188 symbols are actual data, and 16 symbols are check codes. It is then known that, the limit of the error correction capability of the Reed-Solomon decoder 125 is $2E+F \le (204-188)=16$. That is, without knowing the position of any of the erroneous symbols (F=0), given that the number of erroneous symbols in one packet to be correct does not exceed 8 ($E \le 8$), the error correction decoder 125 is capable of correcting all erroneous symbols in this packet to be corrected in the decoding process. In contrast, without knowing the position of any of the erroneous symbols of this packet to be corrected, if the number of erroneous symbols exceeds 8, the error correction decoder 125 can only consider this packet to be decoded non-decodable, i.e., the decoding process of this packet to be decoded is unsuccessful. In another example, assuming that the positions of five erroneous symbols of a packet to be decoded are learned in advance (F=5), in addition to these five erroneous symbols with known positions, the error correction decoder 125 is further capable of correcting five erroneous symbols with unknown positions in this packet to be corrected (F $E \le 5.5$), meaning that the total number of correctable erroneous symbols in this packet has increased to ten symbols (with five known positions and five unknown positions).

The above examples point out one characteristic of the Reed-Solomon coding—if the position information of a part or all of the errors is learned in advance before decoding, the total number of errors that can be corrected by a Reed-Solomon decoder is increased. Therefore, concerning the Reed-Solomon code or an error correction code with the same characteristic above, there is a need for a solution that identifies reliable position information of errors for the use of an error correction decoder.

SUMMARY OF THE INVENTION

The invention is directed to a decoding apparatus and a decoding method. Using input power differences of a signal that needs to be decoded, the decoding apparatus and the decoding method of the present invention are capable of reasonably estimating the position of an error occurring in a codeword to further increase the number of errors that can be corrected.

According to an embodiment of the present invention, a decoding apparatus is provided. The decoding apparatus includes an input power estimating circuit, a controller and an error correction decoder. The input power estimating circuit generates a plurality of estimated input power values for a plurality of sets of data included in a packet that needs to be corrected, and calculates respective power differences between the plurality of estimated input power values and a reference power. The controller determines one or multiple candidate error positions according to one of the plurality of power differences that is higher than a predetermined threshold. The error correction decoder performs a decoding process on the packet according to the one or multiple candidate error positions.

According to another embodiment of the present invention, a decoding method is provided. The decoding method includes following steps. A plurality of estimated input power values are generated for a plurality of sets of data included in a packet that needs to be corrected. Respectively input power differences between the plurality of estimated input power values and a reference power are calculated. One or multiple candidate positions are determined according to one of the plurality of power differences that is higher than a predetermined threshold. According to the one or multiple candidate error positions, a decoding process is performed on the packet.

The above and other aspects of the invention will become better understood with regard to the following detailed description of the preferred but non-limiting embodiments. The following description is made with reference to the accompanying drawings.

Figures 1A, 1B:
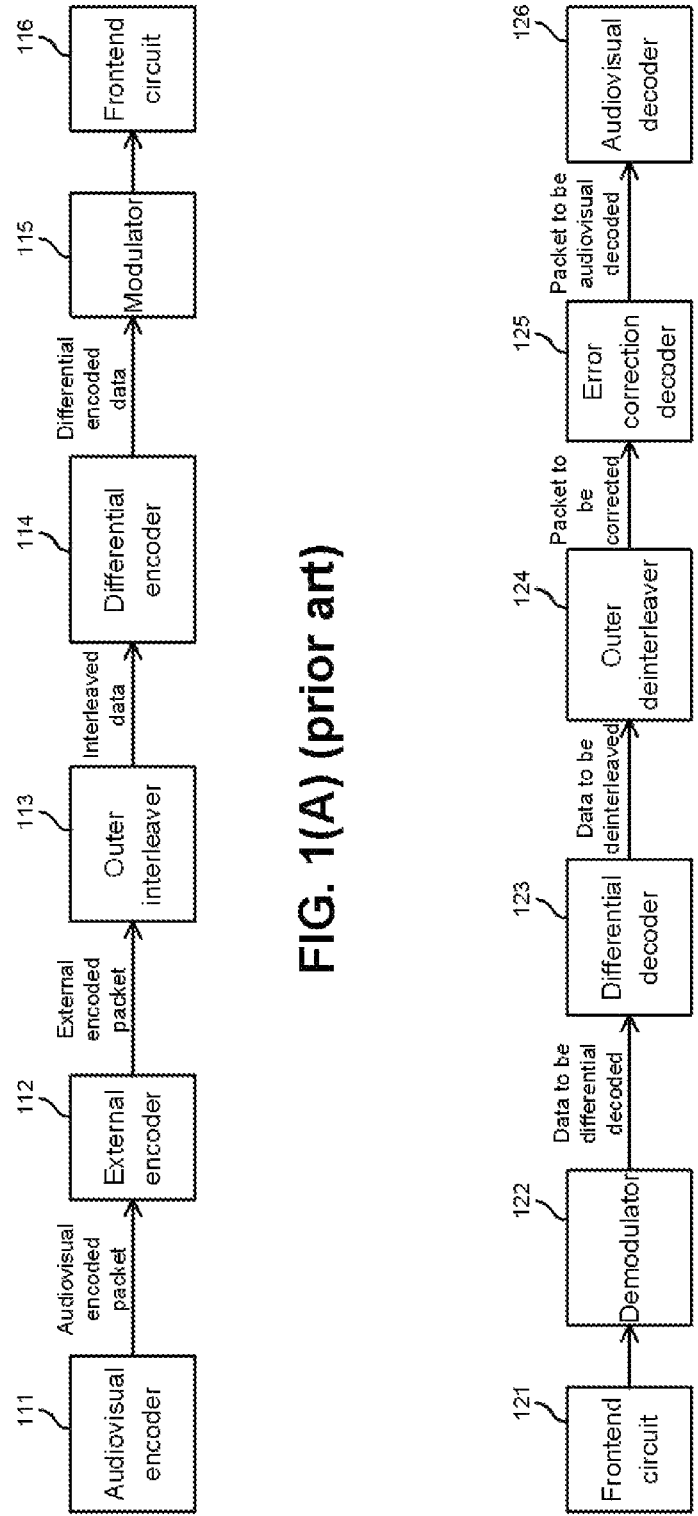
FIG. 1(A) and FIG. 1(B) are function block diagrams of a DVB-C transmitter and a DVB-C receiver, respectively.

It should be noted that, the drawings of the present invention include functional block diagrams of multiple functional modules related to one another. These drawings are not detailed circuit diagrams, and connection lines therein are for indicating signal flows only. The interactions between the functional elements/or processes are not necessarily achieved through direct electrical connections. Further, functions of the individual elements are not necessarily distributed as depicted in the drawings, and separate blocks are not necessarily implemented by separate electronic elements.

DETAILED DESCRIPTION OF THE INVENTION

Figure 2:
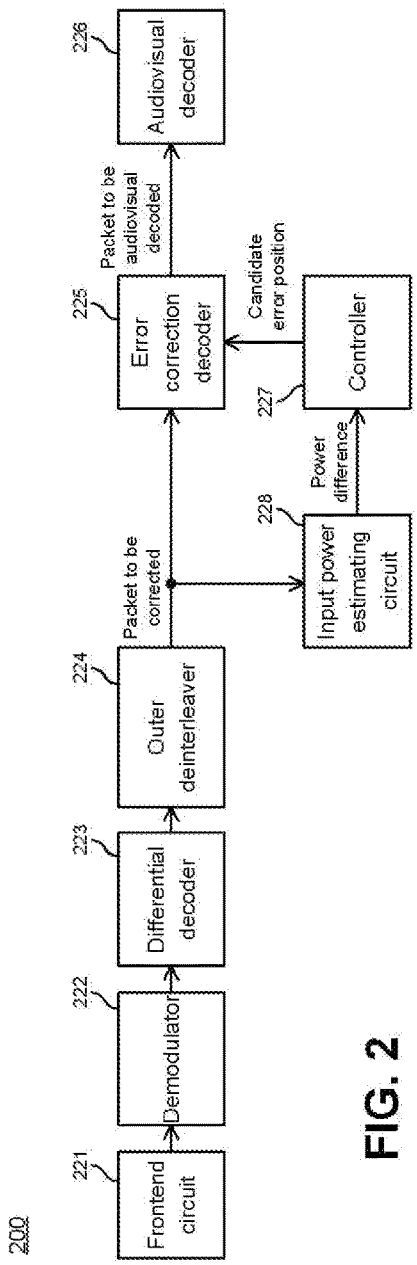
FIG. 2 is a function block diagram of a DVB-C receiver according to an embodiment of the present invention.

A decoding apparatus is provided according to an embodiment of the present invention. The decoding apparatus includes an input power estimating circuit, a controller and an error correction decoder. In practice, the decoding apparatus may be an independent unit, or may be integrated in various types of decoding systems supporting both a decoding function and an error correction function. FIG. 2 shows a function block diagram of the decoding apparatus applied to a Digital Video Broadcasting-Cable (DVB-C) receiver as an example. With the following description, one person skilled in the art can understand that, the spirit of the present invention may be realized using receivers of other specifications, and is not limited to such DVB-C receiver.

As shown in FIG. 2, the DVB-C receiver 200 includes a frontend circuit 221, a demodulator 222, a differential decoder 223, an outer deinterleaver 224, an error correction decoder 225, an audiovisual decoder 226, a controller 227 and an input power estimating circuit 228. Operation details of the frontend circuit 221, the demodulator 222, the differential decoder 223, the outer deinterleaver 224 and the audiovisual decoder 226 are generally known to one person skilled in the art, and shall be omitted herein. Details of the error correction decoder 225, the controller 227 and the input power estimating circuit 228 are given below.

The error correction decoder 225 performs a Reed-Solomon decoding process on a packet that needs to be corrected and outputted from the outer deinterleaver 224, and performs error correction while the decoding process is performed. Corresponding to the outer encoded packets that the outer encoder 112 provides to the outer interleaver 113 in FIG. 1(A), the error correction decoder 225 receives multiple packets to be corrected, each of which including 204 symbols. As previously stated, given that the number of erroneous symbols in one packet that needs to be corrected does not exceed 8, the error correction decoder 225 is nonetheless capable of successfully decoding the packet even if no position information of any error is learned; that is, the error correction decoder 225 is capable of identifying the positions of all erroneous symbols in the packet and correcting all of these erroneous symbols. Conversely, without knowing the position information of any error, if the number of erroneous symbols in one packet (among the packets that need to be corrected) exceeds 8, the error correction decoder 225 is then incapable of correcting any of the erroneous symbols, nor is it capable of learning the position information of any error—such situation is considered unsuccessful decoding.

The input power estimating circuit 228 generates an estimated input power value of each of a plurality of sets of data included in a packet that needs to be corrected. For example, the input power estimating circuit 228 may generate an estimated input power value for each symbol, i.e., generating 204 estimated input power values for each packet that needs to be corrected. Using a comparator or a subtractor, the input power estimating circuit 228 may calculate respective differences (to be referred to as power differences) between the estimated input power values and a reference power and provide these power differences to the controller 227. In general, the power of a symbol without error falls in an approximate known range (which may be generated through experiments or statistics), of which the median value may serve as the reference power. In contrast, the power of a symbol with error is frequently larger than this reference power. It is deduced that, a symbol having a power value that differs greatly from the reference power is much likely an erroneous symbol. Thus, a predetermined threshold may be set, and the controller 227 then identifies a symbol having a power value that is greater the predetermined threshold—such symbol may be regarded as a candidate erroneous symbol. The position/positions of the one or multiple candidate erroneous symbols is/are a candidate error position/candidate error positions. One purpose of setting the threshold is preventing selecting data having rather small input power differences as candidate erroneous symbols.

In one embodiment, before the error correction decoder 225 decodes a packet that needs to be corrected, the input power estimating circuit 228 and the controller 227 first attempt to identify one or multiple candidate error positions for the error correction decoder 225 to refer to. As previously described, if the position information of a part or all of the errors is learned in advance before decoding, the total number of errors that can be corrected by the error correction decoder 225 is increased. That is to say, according to the error position information the controller 227 provides, it is more likely the error correction decoder 225 can successfully decode the packet that needs to be corrected.

In another embodiment, the error correction decoder 225 first attempts to decode a packet that needs to be corrected without knowing any error position information. If the initial decoding process is unsuccessful, the controller 227 then selects one or multiple candidate error positions according to the power differences the input power estimating circuit 228 generates. Next, the controller 227 requests the error correction decoder 225 to again perform the decoding process on the packet further according to the one or multiple candidate error positions. According to the error position information the controller 227 provides, it is possible the error correction decoder 225 successfully decodes the packet in the second decoding process.

In one embodiment, a limit is set in advance for the candidate error positions that the controller 227 provides to the error correction decoder 225. For example, assuming that the limit is 10, the controller 227 at most selects 10 candidate error positions according to the input powers (e.g., selecting 10 symbols having input powers that differ most significantly from the reference power).

Proven by simulated experiments, the candidate error positions that the controller 227 selects according to the input powers do not necessarily correspond to the exact positions of existing erroneous data. Further, selecting candidate error positions that are in fact not erroneous for the error correction decoder 225 to perform the decoding process, may cause the error correction decoder 225 to misjudge that a certain packet has been corrected while in fact that certain packet has not been corrected; that is, the error correction decoder 225 has mistaken the certain packet for another packet. Thus, in another embodiment, the decoding apparatus of the present invention further includes a checking circuit. The checking circuit checks the candidate error positions selected according to the input powers to prevent the above misjudgment, with associated details given below.

Figure 3:
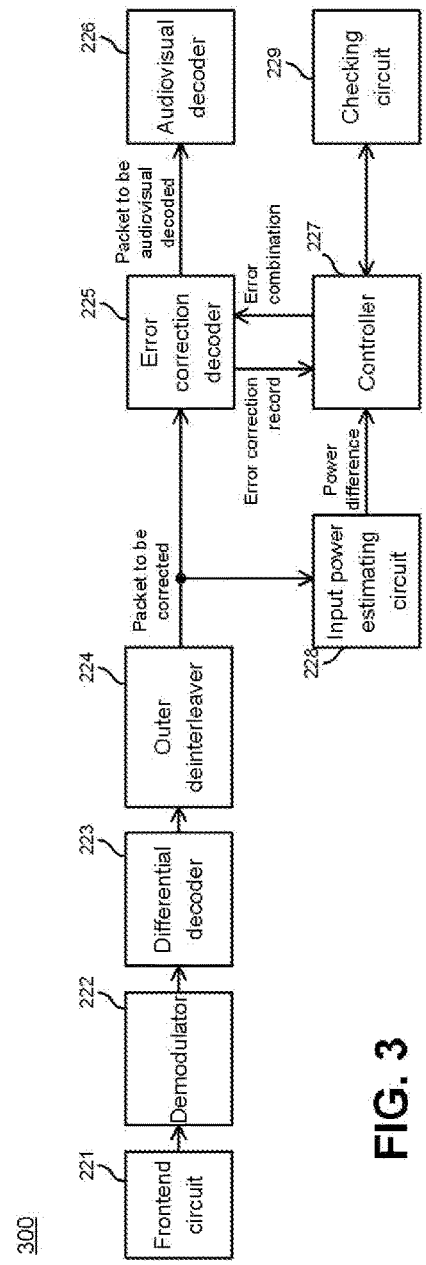
FIG. 3 is a schematic diagram of a decoding apparatus further including a checking circuit according to an embodiment of the present invention.

As shown in FIG. 3, compared to the DVB-C receiver 200, a DVB-C receiver 300 further includes a checking circuit 229. For example, assume that the controller 227 selects six candidate error positions for a packet that needs to be corrected according to input powers. Thus, the controller 227 first selects less than six (e.g., five) candidate error positions from the six candidate error positions as a first error combination, and requests the error correction decoder 225 to perform a decoding process on the packet according to the first error combination. In this embodiment, if the decoding process, which the error correction decoder 225 performs on the packet according to the first error combination, is determined successful, the error correction decoder 225 generates and sends an error correction record to the controller 227, to inform the controller 227 that the packet contained errors and the error correction decoder 225 has corrected positions of the erroneous symbols. Next, according to the error correction record the error correction decoder 225 provides to the controller 227, the checking circuit 229 determines whether the erroneous symbols satisfy an error distribution condition. For example, the error distribution condition may be "three consecutive adjacent symbols in the same packet have been corrected by the error correction decoder 225". In fact, it is a rare occasion where multiple consecutive adjacent symbols are erroneous. That is to say, if the first error combination causes the corrected packet to satisfy the above error distribution condition, it means that the candidate error positions included in the first error combination have poor reliability. Thus, in this embodiment, the controller 227 discards the first error combination, again selects five other candidate error positions from the six candidate error positions as a second error combination, and requests the error correction decoder 225 to again perform the decoding process on the packet according to the second error combination, and so forth.

In practice, the controller 227 may be implemented as a fixed and/or programmable logic circuit, e.g., a programmable logic gate array, an application-specific integrated circuit, a microcontroller, a microprocessor or a digital signal processor. Alternatively, the controller 27 may be designed to complete a designated task through executing a processor command stored in a memory (not shown) Further, the scope of the present invention is not limited to a predetermined storage mechanism. The memory may include one or multiple volatile or non-volatile memory devices, e.g., DRAM, ROM, magnetic and/or optical memories, and flash memories.

A decoding method is further provided according to another embodiment of the present invention. FIG. 5 shows a flowchart of the decoding method, which includes following steps. In step S41, a plurality of estimated input power values are generated for a plurality of sets of data included in a packet that needs to be corrected. In step S42, respective power differences between the plurality of estimated input power values and a reference power are calculated. In step S43, one or multiple candidate error positions are determined according to one of the plurality of power differences that is higher than a predetermined threshold. In step S44, a decoding process is performed on the packet according to the one or multiple candidate error positions.

Figure 4:
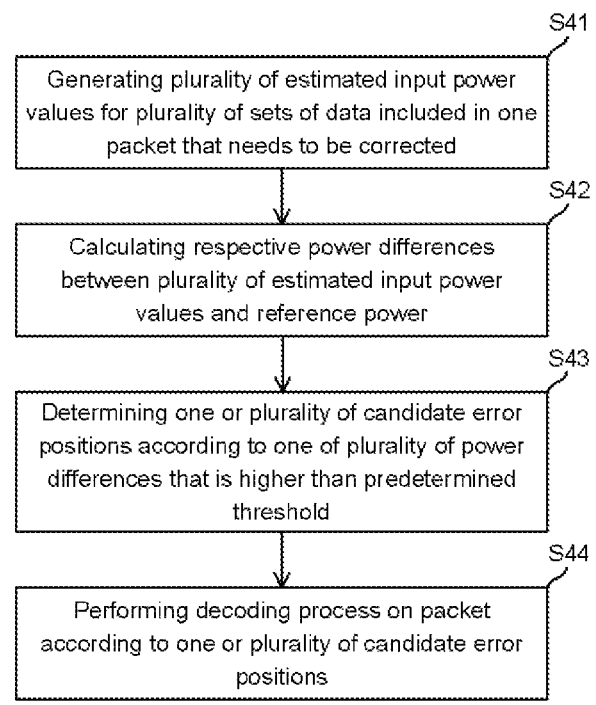
FIG. 4 is a flowchart of a decoding method according to an embodiment of the present invention.

One person skilled in the art can apply variations and operations in the description associated with the DVB-C receivers 200 and 300 are applicable to the decoding method in FIG. 4. Such repeated details are omitted herein. It should be noted that, implementation details of Reed-Solomon code correction and input power estimation are generally known to one person skilled in the art, and shall be omitted herein.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A decoding apparatus, comprising:
    a frontend circuit;
    a demodulator communicatively coupled with the frontend circuit;
    an input power estimating circuit, comprising one of a comparator or a subtractor and communicatively coupled with the demodulator, generating a plurality of estimated input power values for a packet that needs to be corrected, wherein the packet is received via a channel that introduces errors in the packet, and calculating respective power differences, using the one of a comparator and a subtractor, between the plurality of estimated input power values and a reference power to obtain a plurality of power differences;

a controller circuit, determining a plurality of candidate error positions according to the plurality of power differences that is higher than a predetermined threshold; and an error correction decoder, performing a decoding process on the packet according to the plurality of candidate error positions and outputting a corrected packet, wherein after the controller circuit selects the plurality of candidate error positions according to the plurality of power differences, the controller circuit further selects a first error combination from the plurality of candidate error positions and requests the error correction decoder to again perform the decoding process on the packet according to the first error combination;

the decoding apparatus further comprising:

a checking circuit, determining whether the corrected packet satisfies an error distribution condition when the decoding process performed on the packet according to the first error combination is successful;

wherein, when a determination result of the checking circuit is affirmative, the controller circuit selects a second error combination from the plurality of candidate error positions, and requests the error correction decoder to again perform the decoding process on the packet.

2. The decoding apparatus according to claim 1, wherein when the controller circuit determines the plurality of candidate error positions, the number of the plurality of candidate error positions is caused not to exceed a predetermined error limit.

3. A decoding method performed in a digital receiver including a frontend circuit and demodulator communicatively coupled with the frontend circuit, the method comprising:

a) generating a plurality of estimated input power values for a packet that needs to be corrected and that is received via the frontend circuit and demodulated by the demodulator, wherein the packet is received via a channel that introduces errors in the packet;

b) calculating respective power differences, using one of a comparator or a subtractor, between the plurality of estimated input power values and a reference power to obtain a plurality of power differences;

c) determining a plurality of candidate error positions according to the plurality of power differences that is higher than a predetermined threshold; and d) performing a decoding process on the packet according to the plurality of candidate error positions and outputting a corrected packet, wherein step (d) comprises:

selecting a plurality of candidate error positions according to the plurality of power differences;

further selecting a first error combination from the plurality of candidate error positions;

performing the decoding process on the packet according to the first error combination;

determining whether the corrected packet satisfies an error distribution condition when the decoding process performed on the packet according to the first error combination is successful;

selecting a second error combination from the plurality of candidate error positions when the corrected packet satisfies the error distribution condition; and again performing the decoding process on the packet according to the second error combination.

4. The decoding method according to claim 3, wherein step (c) comprises:

determining the plurality of candidate error positions in a way that the number of the plurality of candidate error positions does not exceed a predetermined error limit.

* * * * *